(12) United States Patent
Song et al.

(10) Patent No.: US 11,110,381 B2
(45) Date of Patent: Sep. 7, 2021

(54) VENT FILTER AND RADIO REMOTE UNIT

(71) Applicant: Telefonaktiebolaget LM Ericsson (publ), Stockholm (SE)

(72) Inventors: Xiaogang Song, Nanjing (CN); Pinghua Duan, Nanjing (CN); Guanghua Pan, Nanjing (CN); Zhen Yang, Nanjing (CN); Jinhui Dou, Nanjing (CN); Zhan Ying, Nanjing (CN); Pengxiao Ge, Nanjing (CN); Peng Xu, Nanjing (CN)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 680 days.

(21) Appl. No.: 15/778,210

(22) PCT Filed: Apr. 16, 2018

(86) PCT No.: PCT/CN2018/083205
§ 371 (c)(1),
(2) Date: May 22, 2018

(87) PCT Pub. No.: WO2019/200511
PCT Pub. Date: Oct. 24, 2019

(65) Prior Publication Data
US 2021/0077936 A1    Mar. 18, 2021

(51) Int. Cl.
*B01D 46/40* (2006.01)
*H05K 5/02* (2006.01)

(52) U.S. Cl.
CPC .......... *B01D 46/40* (2013.01); *B01D 2271/02* (2013.01); *B01D 2279/35* (2013.01); *B01D 2279/45* (2013.01); *H05K 5/0213* (2013.01)

(58) Field of Classification Search
CPC ........ B01D 46/00; B01D 46/40; B01D 45/16; B01D 53/002; B01D 53/00;
(Continued)

(56) References Cited

U.S. PATENT DOCUMENTS 5,125,428 A * 6/1992 Rauter ............... B01D 19/0031
                                                 137/199
6,015,444 A * 1/2000 Craft ..................... F16H 57/027
                                                 220/371
(Continued)

FOREIGN PATENT DOCUMENTS

CN    101868131 A    10/2010
CN    201774773 U    3/2011
(Continued)

OTHER PUBLICATIONS

International Search Report and Written Opinion, PCT App. No. PCT/CN2018/083205, dated Jan. 17, 2019, 10 pages.

*Primary Examiner* — Minh Chau T Pham
(74) *Attorney, Agent, or Firm* — Sage Patent Group

(57) ABSTRACT

A vent filter and a Radio Remote Unit having the vent filter. The vent filter includes a first member including a first body having a ventilation path extending through the first body, an inner wall constituting a ventilation hole which is communicated with the ventilation path, and an outer wall constituting a gap between the inner wall and the outer wall. The vent filter also includes a second member including a second body and at least one enclosure wall protruding out from the second body, wherein at least one of the at least one enclosure wall is located outside the outer wall and surrounding the outer wall. Both the inner and outer walls have at least one first groove at an end and each of the at least one enclosure wall has at least one second groove at an end.

16 Claims, 5 Drawing Sheets

(58) Field of Classification Search
CPC ............ B01D 2279/35; B01D 2279/45; F16H 57/027; F16H 57/02; H05K 5/0213
USPC .................... 55/385.4, 320, 385.3, 505, 510; 74/606 R; 220/371, 374
See application file for complete search history.

(56) References Cited

U.S. PATENT DOCUMENTS

| | | | | |
|---|---|---|---|---|
| 8,277,295 | B2 * | 10/2012 | Yano ....................... | F21V 31/03 |
| | | | | 454/270 |
| 8,814,993 | B2 * | 8/2014 | Yano .................... | H05K 5/0213 |
| | | | | 96/4 |
| 8,821,226 | B2 * | 9/2014 | Yano .................... | B65D 77/225 |
| | | | | 454/143 |
| 9,052,119 | B2 * | 6/2015 | Uemura ................ | H05K 5/0213 |
| 9,539,895 | B2 * | 1/2017 | Holzwarth ......... | B01D 46/0031 |
| 10,281,107 | B1 * | 5/2019 | Lacroix ................... | F21S 45/33 |
| 10,371,246 | B2 * | 8/2019 | Frerichs .............. | B01D 53/002 |
| 10,508,572 | B2 * | 12/2019 | Mainiero ........... | F01M 13/0405 |
| 10,781,994 | B2 * | 9/2020 | Yano ....................... | F21S 43/50 |
| 2009/0084078 | A1 * | 4/2009 | Furuyama .............. | B01D 53/22 |
| | | | | 55/385.4 |
| 2009/0107090 | A1 * | 4/2009 | Keel .................. | B01D 46/0012 |
| | | | | 55/385.4 |

FOREIGN PATENT DOCUMENTS

| | | |
|---|---|---|
| CN | 201909072 U | 7/2011 |
| CN | 202140648 U | 2/2012 |
| CN | 202603082 U | 12/2012 |
| WO | 2013/136642 A1 | 9/2013 |

\* cited by examiner

VENT FILTER AND RADIO REMOTE UNIT

CROSS-REFERENCE TO RELATED APPLICATIONS

This application is a National stage of International Application No. PCT/CN2018/083205, filed Apr. 16, 2018, which is hereby incorporated by reference.

TECHNICAL FIELD

The present disclosure generally relates to a technical field of electronic products, and more particularly to a vent filter and a radio remote unit having the same vent filter.

BACKGROUND

At present, it is common for most of electronic products to remain a vent port thereon for a vent filter. When the electronic product is switched on, it will generate heat which shall be dissipated out via ventilation, for avoiding deteriorating performance of the electronic product. Furthermore, once such heat is not sufficient to be dissipated out or transferred to outside environment, the air in the electronic product will be heated up and expanded. As such, a difference between internal air pressure of the electronic product and outside air pressure of the electronic product will be present. Such difference is adverse to the normal operation of the electronic product.

SUMMARY

In view of the foregoing, an object of the present disclosure is to overcome or at least mitigate at least one of above shortcomings in the prior art solution. Herein, the present disclosure proposes out a vent filter and a radio remote unit having the same vent filter.

In accordance with one aspect of the present application, it provides a vent filter, comprising:
a first member comprising a first body having a ventilation path extending through the first body, an inner wall protruding from an end of the first body and constituting a ventilation hole which is communicated with the ventilation path, and an outer wall protruding from the end of the first body and constituting a gap between the inner wall and the outer wall;
a second member comprising a second body and at least one enclosure wall protruding out from the second body, wherein at least one of the at least one enclosure wall is located outside the outer wall and surrounding the outer wall;
wherein both the inner wall and the outer wall have at least one first groove at an end facing away the first body and each of the at least one enclosure wall has at least one second groove at an end facing away the second body.

In some embodiments, the at least one first groove of the outer wall is not aligned with one of the at least one second groove of the at least one of the at least one enclosure wall located outside the outer wall, in a radial direction of the ventilation hole.

In some embodiments, the first member further comprises at least one intermediate wall between the inner wall and the outer wall.

In some embodiments, a further one among the at least one enclosure walls is located in a space between the at least one intermediate wall and one of the inner wall and the outer wall, or located within the gap.

In some embodiments, the second member further comprises at least one ventilation opening extending through the second body, which is configured to be indirectly communicated with the ventilation path.

In some embodiments, the at least one ventilation opening is provided at a periphery of the second body corresponding to the gap of the first member.

In some embodiments, the at least one first groove on the inner wall or the outer wall comprises at least two first grooves uniformly or non-uniformly distributed along a periphery of the inner wall or the outer wall;
the at least one enclosure wall comprises at least two enclosure walls; and
the at least one second groove of each of the at least two enclosure walls comprises at least two second grooves uniformly or non-uniformly distributed along a periphery of the at least one enclosure wall.

In some embodiments, each of the inner wall, the outer and the at least one enclosure wall is shaped in a form of any of a circle, an ellipse, a triangle and a rectangle.

In some embodiments, the first member further comprises a nut adjacent to the inner wall and the outer wall, which is disposed to outwardly protrude from an outside surface of the first body.

In some embodiments, screw threads are located on at least a part of the outside surface.

In some embodiments, the vent filter further comprises a sealing ring located adjacent to the nut.

In some embodiments, the first body is hollow cylinder-shaped, and the second body is circular plate-shaped.

In some embodiments, the at least one first groove of the inner wall and the at least one first groove of the outer wall are disposed in one-to-one correspondence and are aligned with each other in a radial direction of the ventilation hole.

In some embodiments, the gap is not directly communicated with the ventilation path.

In some embodiments, a height of each of the inner wall and the outer wall protruding from the end is equal to or less than a height of the at least enclosure wall protruding from the second body.

In accordance with another aspect of the present application, it also provides a Radio Remote Unit (RRU) includes the vent filter as described above.

BRIEF DESCRIPTION OF THE DRAWINGS

These aspects and/or other aspects as well as advantages of the present application will become obvious and readily understood from the description of the preferred embodiments of the present application in conjunction with the accompanying drawings below, in which.

DETAILED DESCRIPTION OF EMBODIMENTS

In the discussion that follows, specific details of particular embodiments of the present techniques are set forth for purposes of explanation and not limitation. It will be appreciated by those skilled in the art that other embodiments may be employed apart from these specific details.

Furthermore, in some instances detailed descriptions of well-known methods, structures, and devices are omitted so as not to obscure the description with unnecessary detail.

In accordance with one general concept of the present disclosure, it provides a vent filter and a radio remote unit having the vent filter. But please be noted that the vent filter can be used for any kind of electronic products which require the function of dissipating heat via ventilation. In some circumstance, it can also be applicable for dissipating heat via ventilation and having the waterproof function at the same time.

That is, the present vent filter can be used for not only outdoor electronic products, but also indoor electronic products. Furthermore, the present vent filter is sometimes waterproofed, which will be discussed in detail below. In one illustrated example, the present vent filter is provided onto a radio remote unit (RRU), but the present application is not intended to limit to this.

Figure 1A:
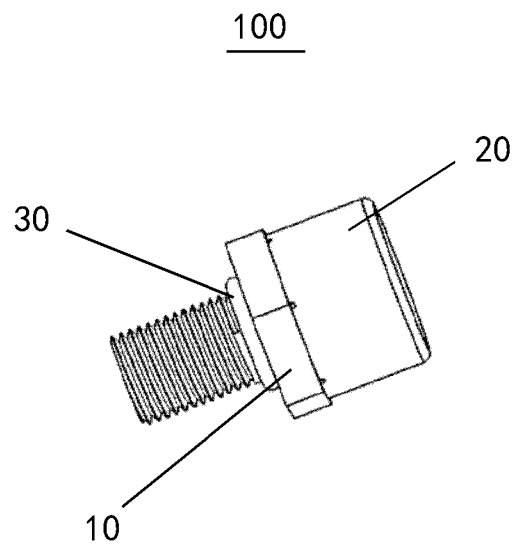
FIG. 1A is a schematic view of a vent filter after being completely assembled, in accordance with an embodiment of the present application.
Figure 1B:
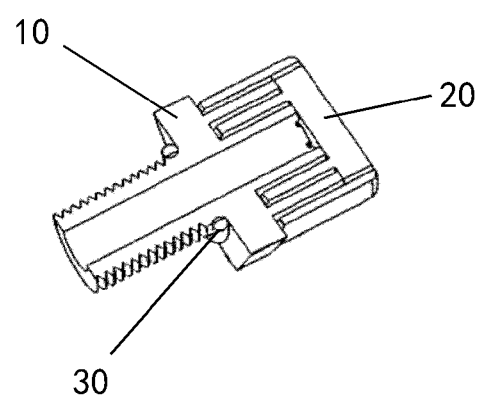
FIG. 1B is a sectional view for schematically showing a structure of the vent filter as shown in FIG. 1A.
Figure 2A:
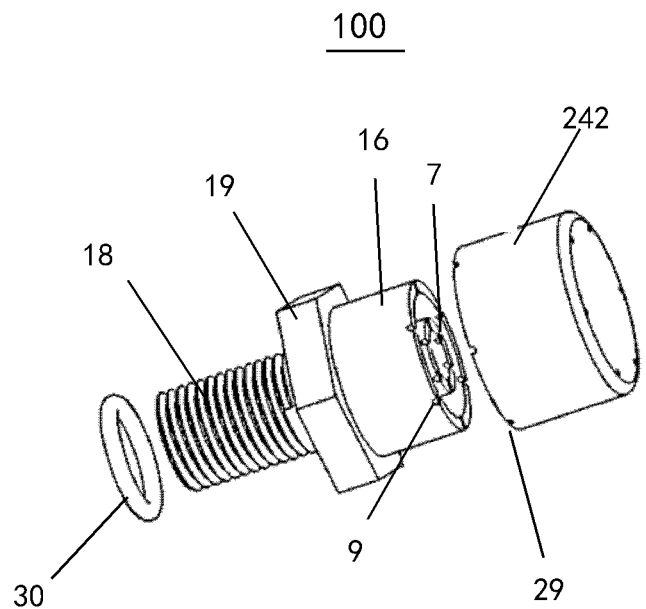
FIG. 2A is an exploded view of the vent filter as shown in FIG. 1A.
Figure 2B:
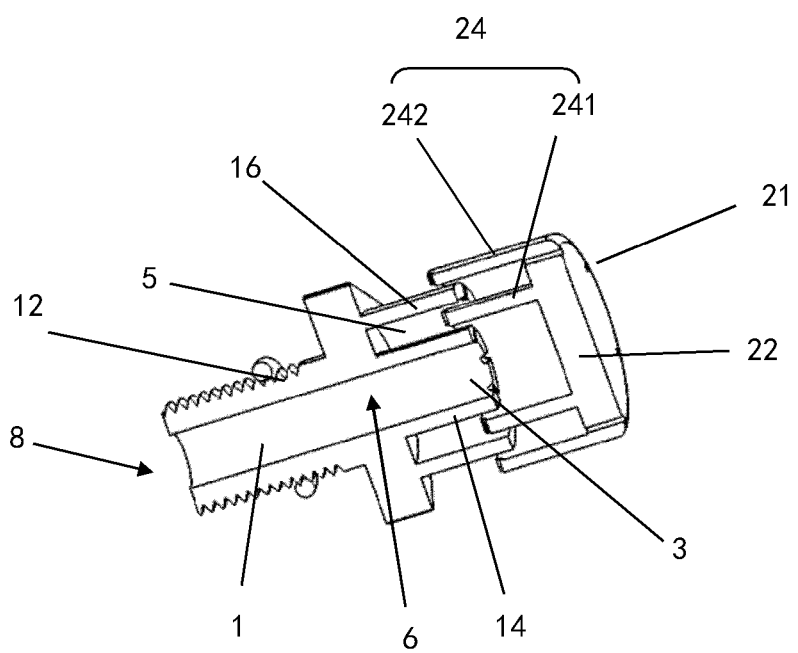
FIG. 2B is a sectional view for schematically showing a structure of the vent filter as shown in FIG. 2A.

Specifically, with reference to FIGS. 1A and 1B in combination with FIGS. 2A and 2B, the vent filter 100 mainly includes two components, i.e., a first member 10 and a second member 20 cooperated with each other. The first member 10 includes a first body 12 having a ventilation path 1 extending through the first body 12, an inner wall 14 protruding from a first end 6 of the first body 12 and constituting a ventilation hole 3 which is communicated with the ventilation path 1, and an outer wall 16 protruding from the first end 6 of the first body 12 and used for constituting a gap 5 between the inner wall 14 and the outer wall 16.

The second member 20 includes a second body 22 and at least one enclosure wall 24 protruding out from the second body 22. At least one of the at least one enclosure wall 24 is located outside the outer wall 16 and surrounding the outer wall 16. Both the inner wall 14 and the outer wall 16 have at least one first groove 7, 9 at an end facing away the first body 12 and each of the at least one enclosure wall 24 has at least one second groove 27, 29 (which is explicitly seen from FIG. 4B) at an end facing away the second body 22.

The present vent filter 100 is in use to allow the air pass through to the outside environment from the second end 8 of the first body 12, via the ventilation path 1, the ventilation hole 3, the at least one first groove 7, 9, the gap 5 and the at least second groove 27, 29 in sequence. It can be known that the first groove 7, 9 and the second groove 27, 29 are configured to permit the flow of the air from the interior space of the electronic products to pass to the outside environment, but at least at some degree blocks the contaminants such as dust or rainwater into the interior space of the vent filter. Even if the dust or rainwater enters the second grooves 29 of the at least one enclosure wall 24 located outside the outer wall 16, it is not possible for them to flow into the gap 5, the ventilation hole 3 or the ventilation path 1 by means of the first grooves 7, 9 and the second grooves 27, since they will be blocked by a wandered path or structure formed by the inner wall 14 and the outer wall 16 with the at least one enclosure wall 24.

Next, various parts of the vent filter 100 will be described in detail.

Before the detailed description, it should be understood that in some embodiments, the first member 10 can be alternatively called as a valve body and the second member 20 can be alternatively called as a valve cap. The reason why the first member 10 and second member 20 are called as the valve body and the valve cap respectively, is intended to emphasize or indicate their functional relationship like these parts in the valve, to let the air flow out the vent filter but not permitting the contaminants such as dust or rainwater flowing into it. It is not intended to limit them in any way.

Figure 3A:
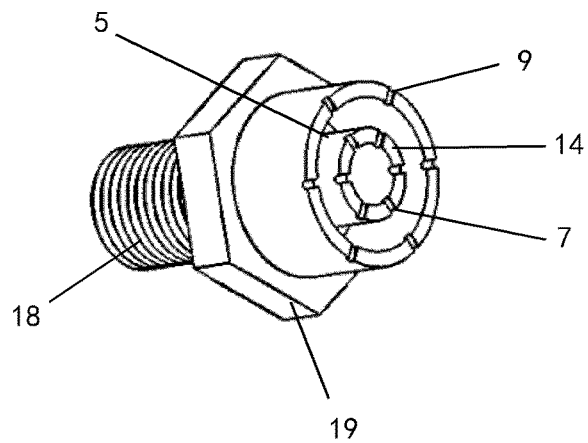
FIG. 3A is a prospective view of a first member of the vent filter as shown in FIG. 1A.
Figure 3B:
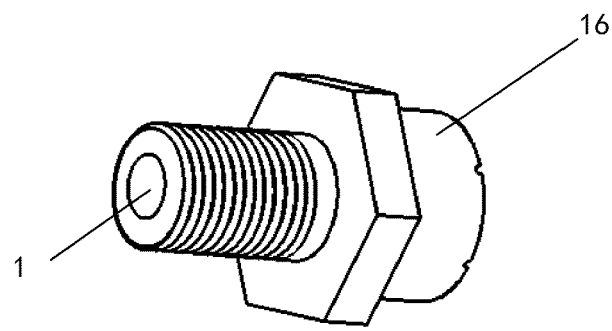
FIG. 3B is another prospective view of the first member as shown in FIG. 3A.
Figure 3C:
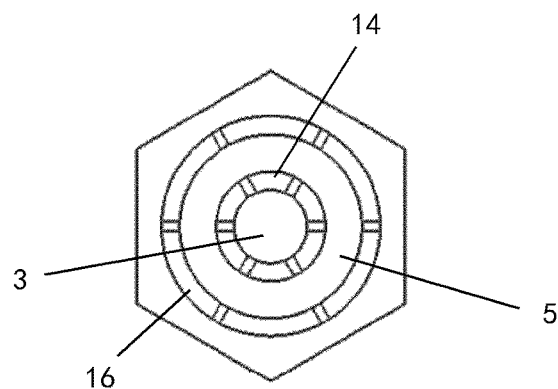
FIG. 3C is an end view of the first member as shown in FIG. 3A.

Further with reference to FIGS. 3A, 3B and 3C, the first member 10 includes the first body 12, the inner wall 14 and the outer wall 16. The ventilation path 1 is located to extend throughout the first body 2 from a first end 6 to a second end 8 opposite to it. In one example, the ventilation path 1 is a central path or passage in the first body 12 to let the air flow therethrough.

In present embodiment, the inner wall 14 used to constitute the ventilation hole 3 for communicating with the ventilation path 1, is designed to be a circle-shaped. In one example, the inner wall 14 has an outside diameter of 18 mm, a thickness of 6 mm, and a height of 20 mm (i.e., a distance protruding from the first end 7). Of course, it can be have any other closed shape, such as ellipse, triangle or rectangle. The inner wall 14 is not limited herein in terms of shape, as long as it has a closed shape.

The at least one first groove 7 on the inner wall 14 is provided on a top face of the end facing away the first body 12. As shown, six first grooves 7 are provided and distributed uniformly along a periphery of the inner wall 14. Of course, they also can be disposed to be un-evenly spaced with each other. A width of each first groove 7 is 6 mm and a depth thereof is 8 mm. Please be noted that in some examples, the first grooves 7 herein can be set to have different widths and depths.

Further, in order to constitute the gap 5 between the inner wall 14 and the outer wall 16, the outer wall 16 is also designed to be a circle-shaped. In one example, the outer wall 16 has an outside diameter of 36 mm, a thickness of 6 mm, and a height of 20 mm (i.e., a distance protruding from the first end 7). Of course, it can be have any other closed shape, such as ellipse, triangle or rectangle. The outer wall 16 herein is not limited herein in terms of shape, as long as it has a closed shape.

The at least one first groove 9 on the outer wall 16 is provided on a top face of the end facing away the first body 12. As shown, six first grooves 9 are provided and distributed uniformly along a periphery of the outer wall 16. Of course, they also can be disposed to be un-evenly spaced with each other. A width of each first groove 9 is 6 mm and a depth thereof is 8 mm. Please be noted that in some examples, the first grooves 9 herein can be set to have different widths and depths.

Please be noted that in the above embodiment, the inner wall 14 and the outer wall 16 are designed to have the same height, the thickness and the identical first grooves, but they can be different from each other.

In one example, the six first grooves 7 on the inner wall 14 and the six first grooves 9 on the outer wall 16 are arranged in one-to-one correspondence and are aligned with each other in a radial direction of the ventilation hole 3. As such, the inner wall 14 and the outer wall 16 are disposed to be concentric. There are also some variations: firstly, the outer wall 16 can have a different number of the first grooves from those of the inner wall 14; and secondly, the first grooves 7 on the inner wall 14 can be not aligned with the first grooves 9 on the outer wall 16.

In an optional example, the gap 5 is not directly communicated with the ventilation path 1. In fact, it is selectable to communicate the gap 5 and the ventilation path 1 via the first grooves 7 and 9, the second grooves 27 (if necessary) and the ventilation hole 3.

The first body 12 is designed to be hollow-cylinder shaped. Apparently, the first body 12 can be disposed to have any other shape. When screwing thread connection is used herein, screw threads 18 are located on at least a part of an outside surface of the first body 12. As shown in FIG. 3C, the screw threads 18 are provided to extend from the second end 8 to the first end 7. Accordingly, the vent port of the electronic product is provided with corresponding screw threads on an inner surface thereof, so as to fit them with each other. In some examples, an outer diameter of the screw threads 18 is 24 mm, and a diameter of the ventilation path 1 is 12 mm.

It should be appreciated that when other connections are used herein for example adhesives or welding, the screw threads are not necessary and thus the first body 12 can have more flexibility on shapes, for example to be rectangular, or triangular.

In some embodiments, the first member 10 further includes a nut 19 adjacent to the inner wall 14 and the outer wall 16. In order to help the installation or the disassembling the vent filter 100 into the corresponding electronic product, the nut 19 is disposed to outwardly protrude from the outside surface of the first body 12. In some example, the nut 19 is in a shape of hexagon and a distance of 45 mm between the two opposing sides thereof. In some examples, the nut 19 is located at the first end 6 of the first body 12.

In some examples, the ventilation path 1 and the ventilation hole 3 are designed to be integral with each other, or are made by the same processing. As can be seen from FIG. 1B, they can be considered to be one through passage in some cases. The inner wall 14 and the outer wall 16 are formed on the disc-shaped protrusion, which is the body of the nut 19 at the same time. In this way, the first member 10 can get a more compact structure and be made by a simple process.

Figure 4A:
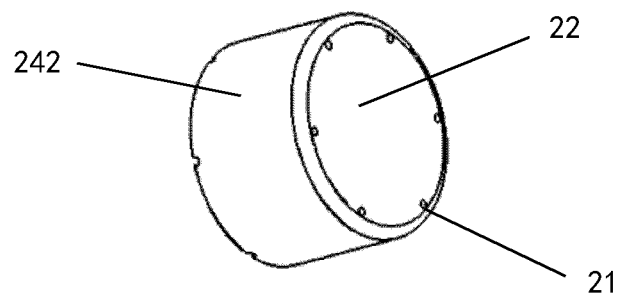
FIG. 4A is a prospective view of a second member of the vent filter as shown in FIG. 1A.
Figure 4B:
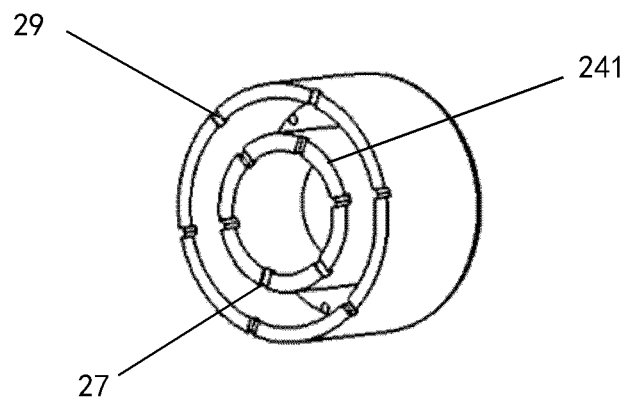
FIG. 4B is another prospective view of the second member as shown in FIG. 4A.
Figure 4C:
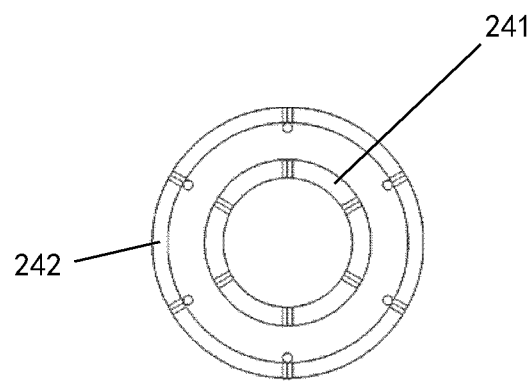
FIG. 4C is an end view of the second member as shown in FIG. 4A.
Figure 5:
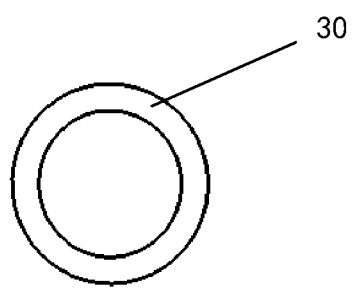
FIG. 5 is a schematic view of a sealing ring of the vent filter as shown FIG. 1A.

Continual to refer to FIGS. 4A, 4B and 4C, the second member 20 is generally shaped in a cup. Of course, the second member 20 is not limited to this as shown in the figures. In some embodiments, the second body 22 is circular plate-shaped. The at least one enclosure wall 24 includes one, two or more than two enclosure walls. In this example, the at least one enclosure wall 24 includes two enclosure walls 241, 242 which are taken as one example for explaining the principle and structure thereof.

The two enclosure walls 24 include an inner enclosure wall 241 and an outer enclosure wall 242. The outer enclosure wall 242 is located outside the outer wall 16 of the first member 10, and the inner enclosure wall 241 is located between the inner wall 14 and the outer wall 16, i.e., being inserted into the gap 5. In one example, the inner enclosure wall 241 has an outside diameter of 27 mm, a thickness of 4 mm, and a height of 20 mm (i.e., a distance protruding from the second body 22). Of course, it can be have any other closed shape, such as ellipse, triangle or rectangle. The inner enclosure wall 241 herein is not limited in terms of shape, as long as it has a closed shape.

Similarly, the outer enclosure wall 242 has an outside diameter of 44 mm, a thickness of 4 mm, and a height of 20 mm (i.e., a distance protruding from the second body 22). Of course, it can be have any other closed shape, such as ellipse, triangle or rectangle. The outer enclosure wall 242 herein is also not limited in terms of shape, as long as it has a closed shape.

It shall be noted that the inner wall 14, the outer wall 16, the inner enclosure wall 241 and the outer enclosure wall 242 all are designed to have the same height of 20 mm. In other examples, they can be disposed to have different heights. For example, the heights of the inner wall 14 and the outer wall 16 can be set to be less than the heights of the inner enclosure wall 241 and the outer enclosure wall 242. In this way, it can at least ensure that the second member 20 can sit on the first member 10 especially the nut 19 thereof, forming a good tightness therebetween.

In some embodiments, the at least one second groove 29 on the outer enclosure wall 242 is provided on a top face of the end facing away the second body 22. As shown, six second grooves 29 are provided and distributed uniformly along a periphery of the outer enclosure wall 242. Of course, they also can be disposed to be un-evenly spaced with each other. A width of each second groove 29 is 7 mm and a depth thereof is 9 mm. Please be noted that in some examples, the second grooves 29 herein can be set to have different widths and depths.

Similarly, the at least one second groove 27 on the inner enclosure wall 241 is provided on a top face of the end facing away the second body 22. As shown, six second grooves 27 are provided and distributed uniformly along a periphery of the inner enclosure wall 241. Of course, they also can be disposed to be un-evenly spaced with each other. A width of each second groove 27 is 7 mm and a depth thereof is 9 mm. Please be noted that in some examples, the second grooves 27 herein can be set to have different widths and depths.

Please be noted that in the above embodiment, the inner enclosure wall 241 and the outer enclosure wall 242 are designed to have the same height, the thickness and the identical second grooves, but they can be different from each other. In one example, the six second grooves 27 on the inner enclosure wall 241 and the six second grooves 29 on the outer enclosure wall 242 are arranged in one-to-one correspondence and are aligned with each other in a radial direction of the ventilation hole 3. In other words, the inner enclosure wall 241 and the outer enclosure wall 242 are disposed to be concentric. But there are also some variances: firstly, the outer enclosure wall 242 can have a different number of the second grooves 29 from those of the inner enclosure wall 241; and secondly, the second grooves 27 on the inner enclosure wall 241 can be not aligned with the second grooves 29 on the outer enclosure wall 242.

In some embodiments, as shown in FIGS. 2A and 2B, the at least one first groove 9 of the outer wall 16 is not aligned with one of the at least one second groove 29 of the at least one of the at least one enclosure wall 242 located outside the outer wall 16, in a radial direction of the ventilation hole 3. That is, the first grooves 9 of the outer wall 16 are not aligned with the second grooves 29 on the outer enclosure wall 242 in the radial direction of the ventilation hole 3. In a further embodiment, the first grooves 7 of the inner wall 14 are not aligned with the second grooves 29 on the outer enclosure wall 242 and/or the second grooves 27 on the inner enclosure wall 241 in the radial direction of the ventilation hole 3. With such arrangement, it is beneficial to block the rainwater into the interior of the vent filter 100.

Further, the second member 20 further includes at least one ventilation opening 21 extending through the second body 22, which is configured to be indirectly communicated with the ventilation path 1. In FIG. 4A, it shows out six ventilation openings 21 provided evenly along the periphery of the second body 22. It is selectable to arrange the ventilation openings 21 corresponding to the gap 5 of the first member 10. The size of the at least one ventilation opening 21 can be identical with or comparatively with that of the second grooves 27, 29 or the first grooves 7, 9. Of course, the at least one ventilation opening 21 can have any other sizes.

In the completed assembly of the vent filter 100, as shown in FIG. 1A, the vent filter 100 further includes a sealing ring 30 located adjacent to the nut 19. It is used to seal the space between the vent filter 100 and the vent port of the electronic product. Normally, it is made from rubber materials or the like. In some example, an outer radius of the sealing ring 30 is 15 mm and an inner radius thereof is 11 mm. The inner radius is normally set to be less than the radius of the screw threads 18 (in this example, 12 mm) and/or the outer radius thereof is less than size of the nut 19, in order to achieve the sealing function.

The sealing ring 30 in use is to fix on a surface of the nut 19 from the second end 8 of the first body 12, and the second member 20 is fixed on to another surface of the nut 19 from the first end 7 of the first body 12. That is, the sealing ring 30 and the second member 20 are assembled onto two opposite surfaces of the nut 19. It should be understood that the sealing ring 30 and the second member 20 can be assembled onto the other parts of the first member 10 except the nut 19 as required.

In an variant of the vent filter in accordance with the embodiment of the present application, the first member 10 has at least one intermediate wall between the inner wall 14 and the outer wall 16, and at one additional enclosure wall 14 is located in a space between the at least one intermediate wall and one of the inner wall 14 and the outer wall 16. In other words, the first member 10 and the second member 20 both can have more than two walls or enclosure walls, which are arranged to interlace with each other. The specific arrangement thereof is not limited herein. In some embodiments, one or more enclosure walls 24 are set to be located in the gap 5.

The vent filter provided in accordance with some embodiments of the present can be installed in any desired direction, that is, there is no limitation on installing directions. Due to the alternating arrangement of the walls on the first member with the enclosure walls on the second member, a wandering path for passing the air is formed therein. However, due to this wandering path, the contaminants like rainwater or dust cannot enter the interior of the vent filter 100 through the grooves on the first and second members. The present vent filter can dispense out the membrane element which let air pass through but would not let the rainwater enter.

Especially, when a plurality of the second grooves are provided on the at least one enclosure wall, the rainwater can flow out from one of the second grooves due to gravity thereof, even if it enter through another of the second grooves, no matter what direction they are located, for example in an inclined direction, an uprightly upward direction or an uprightly downward direction. Once the rainwater enters the gap of the vent filter behind the outer enclosure wall, it would not pass by the outer wall or the inner enclosure wall, since due to gravity, it will flow out of the vent filter.

In order to further explain or illustrate the arrangement or principle of the present vent filter, the flow path of the air is indicated herein in combination with the drawings. The air exits the interior of the electronic product by flowing through the ventilation path 1, the ventilation hole 3, the first grooves 7 on the inner wall 14, the gap 5, the second grooves 27 on the inner enclosure wall 241, the first grooves 9 on the outer wall 16 and the second grooves 27 on the outer enclosure wall 242. When the ventilation opening 21 is provided, when the air enters the gap 5, it also can direct flow out through the ventilation opening 21. Thus, it can be seen that the flow path of the air is curved or wandering, but due to the expansion of the air in the electronic products, this would not block the air. Instead, the rain water or the like cannot come from the outside environment into the electronic product by using the same but opposite flow path of the air. In this way, the present vent filter effectively blocks the flowing of rainwater it but permits the sufficient air to flow out. In some examples, the size of the ventilation opening 21 is configured to not let the rainwater flow in but the air flow out.

With such configuration, the vent filter in accordance with some specific embodiment of the present application can achieve the waterproof function to the rainwater, while the heat can be dissipated out via the ventilation of air.

In accordance with another embodiment of the present application, it also provides a Radio Remote Unit (RRU). The RRU unit includes at least one ventilation port and the vent filter as described above. Specifically, the vent filter is fixed with the vent port by thread connection or other means.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall into the scope of the disclosure.

What is claimed is:

1. A vent filter, comprising:
   a first member comprising a first body having a ventilation path extending through the first body, an inner wall protruding from an end of the first body and constituting a ventilation hole which is communicated with the ventilation path, and an outer wall protruding from the end of the first body and constituting a gap between the inner wall and the outer wall; and
   a second member comprising a second body and at least one enclosure wall protruding out from the second body, wherein at least one of the at least one enclosure wall is located outside the outer wall and surrounding the outer wall;
   wherein both the inner wall and the outer wall have at least one first groove at an end facing away the first body and each of the at least one enclosure wall has at least one second groove at an end facing away the second body.

2. The vent filter as claimed in claim 1, wherein the at least one first groove of the outer wall is not aligned with one of the at least one second groove of the at least one of the at least one enclosure wall located outside the outer wall, in a radial direction of the ventilation hole.

3. The vent filter as claimed in claim 1, wherein the first member further comprises at least one intermediate wall between the inner wall and the outer wall.

4. The vent filter as claimed in claim 1, wherein a further one among the at least one enclosure walls is located in a space between at least one intermediate wall and one of the inner wall and the outer wall, or located within the gap.

5. The vent filter as claimed in claim 1, wherein the second member further comprises at least one ventilation opening extending through the second body, which is configured to be indirectly communicated with the ventilation path.

6. The vent filter as claimed in claim 5, wherein the at least one ventilation opening is provided at a periphery of the second body corresponding to the gap of the first member.

7. The vent filter as claimed in claim 1, wherein the at least one first groove on the inner wall or the outer wall comprises at least two first grooves uniformly or non-uniformly distributed along a periphery of the inner wall or the outer wall;
the at least one enclosure wall comprises at least two enclosure walls; and
the at least one second groove of each of the at least two enclosure walls comprises at least two second grooves uniformly or non-uniformly distributed along a periphery of the at least one enclosure wall.

8. The vent filter as claimed in claim 1, wherein each of the inner wall, the outer and the at least one enclosure wall is shaped in a form of any of a circle, an ellipse, a triangle and a rectangle.

9. The vent filter as claimed in claim 1, wherein the first member further comprises a nut adjacent to the inner wall and the outer wall, which is disposed to outwardly protrude from an outside surface of the first body.

10. The vent filter as claimed in claim 9, wherein screw threads are located on at least a part of the outside surface.

11. The vent filter as claimed in claim 9, wherein the vent filter further comprises a sealing ring located adjacent to the nut.

12. The vent filter as claimed in claim 1, wherein the first body is hollow cylinder-shaped, and the second body is circular plate-shaped.

13. The vent filter as claimed in claim 1, wherein the at least one first groove of the inner wall and the at least one first groove of the outer wall are disposed in one-to-one correspondence and are aligned with each other in a radial direction of the ventilation hole.

14. The vent filter as claimed in claim 1, wherein the gap is not directly communicated with the ventilation path.

15. The vent filter as claimed in claim 1, wherein a height of each of the inner wall and the outer wall protruding from the end is equal to or less than a height of the at least enclosure wall protruding from the second body.

16. A Radio Remote Unit comprising a vent filter, wherein the vent filter comprises:
a first member comprising a first body having a ventilation path extending through the first body, an inner wall protruding from an end of the first body and constituting a ventilation hole which is communicated with the ventilation path, and an outer wall protruding from the end of the first body and constituting a gap between the inner wall and the outer wall; and
a second member comprising a second body and at least one enclosure wall protruding out from the second body, wherein at least one of the at least one enclosure wall is located outside the outer wall and surrounding the outer wall;
wherein both the inner wall and the outer wall have at least one first groove at an end facing away the first body and each of the at least one enclosure wall has at least one second groove at an end facing away the second body.

* * * * *